3,230,088

PROCESS FOR PREPARING PRINTING PLATES FROM PHOTOSENSITIZED POLYVINYL ALCOHOL COMPOSITIONS

Dolor N. Adams, Cleveland Heights, and Edward Czapor, Newburgh Heights, Ohio, assignors to Harris-Intertype Corporation, Cleveland, Ohio, a corporation of Delaware No Drawing. Filed June 15, 1961, Ser. No. 117,285
9 Claims. (Cl. 96—35)

The present invention relates to a printing plate and, more particularly, to improvements in an etched letterpress printing plate employing polyvinyl alcohol as the resist material for the etching step.

It has previously been suggested to use polyvinyl alcohol as the resist or stencil in preparing an etched printing plate. In general, a metal base is coated with a light-sensitized polyvinyl alcohol and after exposure through a negative the plate is developed, as by washing with water, to remove the unexposed, unhardened areas of the polyvinyl alcohol. At this juncture it is still necessary further to harden the exposed areas of the resist which defines the pattern or design of the printing plate. This is accomplished by treating with an aqueous chromic acid bath and then heating the plate, commonly referred to as a bake or burn-in.

Prior to the present invention, this heating step has been carried out at a relatively high temperature, for example, 450° F. to 500° F. and even 600° F. At such relatively high temperatures, metallurgical changes can take place in the metal constituting the backing plate, for instance, making it coarsely crystalline. Moreover, these relatively high bake temperatures promote the formation of a residual film of polyvinyl alcohol over a metal base which is only removed with difficulty by an etching operation, usually resulting in uneven etching operation. This inherent disadvantage of relatively high burn-in temperatures is additionally augmented if a counter-etching step is used. This step deposits a copper smut (as from copper impurities in the metal) which further insolubilizes the residual film of polyvinyl alcohol. Also, as descumming agents are used in an attempt to remove the residual film, damage may ensue to the relatively unhardened resist.

In contrast, the present invention provides a substantial lowering of a baking temperature required to produce a satisfactory resist of polyvinyl alcohol. This improvement is important to all platemakers, but it is especially important to a printer who formerly obtained his etched plates from a trade shop and who now wishes to avail himself of the more recently introduced thin, flexible, metal plates. By means of the present invention, the printer is now able to do so within his own establishment, since it is not necessary to purchase specially designed, high temperature baking equipment. Instead, the printer can readily use standard equipment found in all printing and developing plates, such as a whirler and low temperature drying means, for instance, infrared lamps.

It is, therefore, a principal object of the present invention to lower the baking temperature required to produce a satisfactory resist of polyvinyl alcohol.

Another object is to provide a method of producing an etched printing plate having a polyvinyl alcohol resist heat-hardened at relatively low temperatures.

A further object is to provide a plate adapted for etching having a polyvinyl alcohol resist that has been baked at relatively low temperatures in accordance with the present invention.

A still further object is to minimize the formation of a residual polyvinyl alcohol film over the metal surface of a sheet forming the backing or support member of an etched plate and thereby provide more reproducible results by such plate.

Other objects of the invention will become apparent as the description proceeds.

To the accomplishment of the foregoing and related ends, the invention consists of the features hereinafter fully described and particularly pointed out in the claims, the following disclosure describing in detail the invention, such disclosure illustrating, however, but one or more of the various ways in which the invention may be practiced.

The objects of the invention are realized primarily in the coloring and hardening of the resist areas prior to the ultimate heat-hardening or burn-in operation. In particular, following exposure of a light-sensitized polyvinyl alcohol film or coat on a metal-surfaced support member, the support member or plate is developed as by washing with water to remove the unhardened, unexposed areas of polyvinyl alcohol and leave the relatively hardened exposed areas composed of the light-decomposition products of the light-sensitized polyvinyl alcohol. In accordance with the present invention these areas, defining the resist or stencil, are then sequentially treated with an alcohol solution of tannic acid and then with a chromic acid solution of copper bichromate. The support member and resist are next baked further to heat-harden the resist areas. In the present case, the baking temperature may be about 225° F. and as low as about 180° F. for about 10 to about 15 minutes. Finally, the palte and resist are etched in accordance with known procedures.

Polyvinyl alcohol from which the resist is prepared is known in the art and may be purchased, for example, under the tradename Elvanol. As stated in U.S. Patent No. 2,830,899 to Brown, which is hereby incorporated by reference, polyvinyl alcohol in general does not represent a single material but rather a family of materials having varying degrees of polymerization and varying saponification numbers. Polyvinyl alcohols may range from a relatively low degree of polymerization as indicated by a viscosity of a four percent dispersion in water of from four to six centipoises to a relatively high degree of polymerization as indicated by a viscosity of a four percent water dispersion of from 35 to 55 centipoises. This range, however, is not critical. The polyvinyl alcohol is made sensitive to light by the incorporation of a suitable sensitizer. A bichromate or dichromate is ordinarily employed and can be any bichromate used for such purpose in conventional resists. Ammonium bichromate and alkali metal bichromates, such as sodium or potassium bichromates, are desirable, ammonium bichromate being preferred since ammonia volatilizes and is removed during drying of the coating. Polyvinyl alcohol dispersions containing from about two to about twelve percent of a bichromate sensitizing agent, based on dry weights of polyvinyl alcohol and bichromate, are satisfactory for most applications. The solids content of a polyvinyl alcohol bichromate aqueous dispersion to be used for making a resist may range from about six percent to about fourteen percent.

The support member which receives the light-sensitized polyvinyl alcohol coat may be metal-surfaced but usually is in the form of a metal sheet for example, about 0.025 inch to about 0.032 inch in thickness, especially if a plate is contemplated that can be easily flexed and fastened around a printing roller. The metal may be aluminum, zinc, magnesium, copper, alloys of such metals, brass and stainless steel. However, the first three metals are preferred. Exposure of the plate is carried out in a conventional manner as by subjecting the plate to light through a negative from a carbon arc. An exposure of five minutes at about 3000 foot candles may be used. The plate is then washed with a developing solution such as water to flush away the unexposed areas of the bichromated polyvinyl alcohol and form a resist.

The resist areas are now at a stage to be treated in accordance with the present invention. Such areas are subjected sequentially to an alcoholic solution of tannic acid and then a chromic acid solution of copper bichromate. The tannic acid solution may be regarded as a developer-hardener, and the chromic acid solution may be considered as a fixing or tanning agent. It is emphasized that the resist areas must be treated with the solutions in the order stated. If such areas are treated first with the chromic acid solution and then with the tannic acid-alcohol solution, a very poor plate results. The described solutions of tannic acid and copper bichromate may be applied to the resist areas in a number of ways including dipping the plate in such solutions, pouring the solutions over the plate, spraying, etc. Normally, treatment by the alcohol-tannic acid solution may be for about 1 to about 2 minutes; and treatment by the chromic acid-copper bichromate solution may also be for about 1 to about 2 minutes.

The polyvinyl alcohol resist absorbs the tannic acid which then effects a desired hardening action, toughening the resist to withstand machine etching such as is used in the Dow etch process. If too much tannic acid is used, reticulation and cracking of the resist may result. Therefore, the optimum concentration of tannic acid as a rule is the minimum required to effect sufficient hardening of the resist to enable it to withstand the subsequent etching operation. In general, the aqueous solution should contain from about 0.1 percent to about 9 percent by weight of tannic acid calculated on a dry basis. Test data show that ten grams of dry tannic acid in 100 milliliters of 20 percent by volume ethyl alcohol aqueous solution provides maximum hardening. Increasing the tannic acid beyond this amount improves the plate but at a greatly reduced rate. The formula for about one gallon of this preferred solution is as follows:

| Ingredient: | | Amount |
|---|---|---|
| Tannic acid | grams | 350 |
| Ethyl alcohol | milliliters | 700 |
| Water | do | 2800 |

APPROXIMATE CONSTANTS

Percent solids (N.V.M.): 8.75%
Sp. gr. at 20° C.: 1.0110
Surface tension: 45 dynes/cm.
pH: 3.2 to 3.3

The alcohol in the tannic acid solution has been found to be of much value in the hardening process. When the alcohol is removed a much poorer plate results. It is not definitely known why the presence of alcohol augments the hardening process. One possible explanation may lie in the fact that some substances have the capacity to absorb more material as they swell but their ability to absorb becomes less pronounced. The alcohol may therefore reduce the swelling to a point where maximum penetration of the resist areas by the tannic acid results. It is probable that the alcohol is oxidized during the subsequent steps in the preparation of the printing plate. Since no particular chemical reaction is contemplated for the alcohol, a wide range of alcohols may be used for the purpose described. In general, liquid aliphatic alcohols may be used. Monohydric alkyl alcohols of one to three carbon atoms are preferred. Increasing the alcohol concentration up to 20 percent by volume results in increasingly better plates. Increasing the alcohol content beyond 20 percent results in a sharp drop in the hardening effect. On the other hand, as little as 8 percent by volume of the alcohol produces acceptable results.

The chromic acid solution of copper bichromate should not be too acid in order to avoid reaction with the metal plate or sheet. Also, if this solution is too acid, the resist although hardening as desired loses its adhesion to the plate and may actually leave the plate. In general, the chromic acid solution should have a pH in the range of about 1.0 to about 3.8. On a weight basis, chromic acid may be present in an amount from about 0.5 percent to about 1.5 percent of the aqueous solution. It is to be understood that these concentrations and strengths correspond to the solution as actually used. Often a plate is wet due to prior operations, so that the acid solution may be applied in stronger concentrations and become diluted on the plate to within the concentrations mentioned.

Copper bichromate may be added directly to the chromic acid to provide the desired solution. Or cupric chloride, as an example of one copper salt, can be added to a chromic acid solution of ammonium bichromate. It is desirable to form the copper bichromate in the solution since this simultaneously provides a control on the strength of the chromic acid. A preferred technique is to prepare copper bichromate in solution by partially neutralizing a relatively strong solution of chromic acid with basic copper carbonate, carbon dioxide being released. In this manner, it is possible to start with different concentrations of chromic acid and then neutralize all but the equivalent of one percent chromic acid. For example, with an aqueous solution of three percent chromic oxide ($CrO_3$) two-thirds was neutralized with basic copper carbonate; with a solution of six percent chromic oxide, five-sixths was neutralized with such carbonate; and the like. Thus the chromic acid content was left the same in each case while the copper bichromate concentrations were changed.

An aqueous solution of six percent chromic oxide, five-sixths neutralized as described, was found to give maximum hardening. Increasing the concentration of copper bichromate beyond this amount did not provide any added benefit. This six percent concentration limit was found to remain constant no matter what concentration of tannic acid was used in the preceding step. This amounts to about 7 percent by weight of copper bichromate in the solution. On the other hand, as little as 2 percent by weight of copper bichromate in the chromic acid solution also produces acceptable results.

With respect to neutralizing a chromic acid solution as described, on a stoichiometric basis, 0.55 gram of basic copper carbonate is needed to react with one gram of chromium oxide ($CrO_3$). In the formula used, 0.57 gram of basic copper carbonate was used for every gram of chromium oxide to be neutralized. The formula for about one gallon of this preferred solution is as follows.

| Ingredient: | | Amounts |
|---|---|---|
| Chromium oxide ($CrO_3$) | grams | 228 |
| Basic copper carbonate | do | 108 |
| Water | ml | 3572 |

APPROXIMATE CONSTANTS

Sp. gr. at 20° C.: 1.0660
pH: 1.1 to 1.2

Using this solution in combination with the preferred tannic acid solution previously described enabled polyvinyl alcohol resist areas to be baked under infrared bulbs (180° F.) within 15 minutes.

After the resist areas are baked as described, the temperature ranging for example from about 180° F. to about 225° F., the plate may then be etched by any of the known techniques. For instance, the etching may be carried out by electrolytic etching where the surface to be etched is made the anode in an electrolytic cell in which the electrolyte is the etching medium and electrical energy then impressed across the cell; or by the method of the U.S. Patent No. 2,472,304 (for aluminum) in which the etchant is an aqueous solution containing at least 0.5 percent by weight of a compound selected from the group consisting of barium hydroxide and strontium hydroxide; or by a standard Mark Smith etching machine; or by the Dow method in which the etchant is impinged against the plate in a direction substantially normal thereto. In the last technique, etching solutions and procedures may be employed such as those described in U.S. Patents Nos. 2,640,763, 2,640,764, 2,640,765, 2,640,766, 2,640,767, and 2,763,536, all of which are incorporated by reference.

In order to demonstrate the invention, the following example is set forth for the purpose of illustration only. Any specific enumeration or detail mentioned should not be interpreted as a limitation of the invention unless specified as such in one or more of the appended claims and then only in such claim or claims.

*Example*

As a metal plate is received from a manufacturer, its surface repels water due principally to the presence of oil and the like from the rolling mills. The surface must be made water-receptive. For example, in this case a plate of zinc having a thickness of 0.025 inch and free of surface blemishes was sponged with a desensitizing solution consisting of a water solution of methyl Cellosolve, lactic acid, and a wetting agent consisting essentially of sorbitan monolaurate. The plate was then rinsed with tap water using the same sponge to swab the surface. This "pre-etch" step cleaned the zinc surface to obtain better wetting and adherence by a light-sensitized coating.

With the plate whirling in a conventional horizontal whirler at about 80 revolutions per minute, an aqueous solution of ammonium bichromated polyvinyl alcohol (9 percent solids) was poured slowly onto the center of the plate and allowed to coat the entire surface. While the whirler was still in operation, a bank of infrared lamps positioned over one side of the whirler evaporated the solvent and deposited the bichromated polyvinyl alcohol as a photosensitizer. The back of the plate was warm to the touch when the coating had reached the desired dry stage.

The plate was next exposed through a negative, a carbon arc of about 3000 foot candles being used. The exposure lasted for five minutes. In addition to the principal object of differentially hardening the photosensitizer, the severity of the exposure need only be sufficient to produce a stencil or resist hard enough to withstand subsequent development. The plate was now washed with warm tap water, about 150° F. for 1.5 minutes to remove the unexposed polyvinyl alcohol.

The plate was next immersed for two minutes in an aqueous alcoholic solution of tannic acid comprising about 20 percent by volume of denatured ethyl alcohol and 10 grams of dry tannic acid per 100 milliliters of solution. The solution had a temperature of 80° F. A tanning solution, also having a temperature of about 80° F., was then flowed over the plate and resist areas, the plate rocked for one to two minutes, and after draining flushed with a water spray. This tanning solution was prepared by neutralizing a six percent by weight aqueous solution of chromic oxide with basic copper carbonate until an equivalent of one percent chromic acid solution was obtained having a pH of 1.2. Copper bichromate was produced as a result of the neutralization.

The plate was now flushed with deionized water and then dried briefly under infrared lamps to remove the bulk of the water. Fan drying could also have been used, or the plate could have been whirled dry in a whirler. The plate was next baked at 180° F. for 15 minutes to harden the resist still further and improve its bond to the zinc plate. Finally, the plate was etched in a machine embodying the Dow etch method. After this etching operation, the plate was wrapped around a roller of a press for a desired printing operation.

In the foregoing example, known equivalent materials such as those disclosed herein may be substituted for those stated in the example, the times and temperatures and other parameters being adjusted where and if needed as easily determined by trial and error.

Other forms embodying the features of the invention may be employed, change being made as regards the features herein disclosed, provided those stated by any of the following claims or the equivalent of such features be employed.

We therefore particularly point out and distinctly claim as our invention:

1. In the method of forming a polyvinyl alcohol resist by coating a metal-surfaced support member with a light-sensitized polyvinyl alcohol, exposing selected areas of the coat to light, removing the unexposed areas of the coat, treating the exposed areas with an aqueous acid solution, and then heat-hardening the treated exposed areas; the improvements comprising in combination effecting such acid solution treatment by treating the exposed areas sequentially with an alcoholic solution of tannic acid and then a chromic acid solution of copper bichromate prior to such heat-hardening step, whereby such hardening step may be carried out at a substantially lower temperature.

2. In the method of forming a polyvinyl alcohol resist by coating a metal-surfaced plate with polyvinyl alcohol sensitized to light by a bichromate, exposing selected areas of the coat to light to harden such areas, removing the unexposed areas of the coat, treating the exposed areas with an aqueous acid solution, washing the plate to remove the acid solution, and then heat-hardening the treated exposed areas; the improvements comprising in combination effecting such acid solution treatment by treating the exposed areas sequentially first with an alcoholic solution of tannic acid and then with an aqueous chromic acid solution of copper bichromate prior to such heat-hardening step, whereby such hardening step may be effected at a temperature below about 225° F.

3. The method of claim 2 wherein such alcoholic solution contains about 0.1 percent to about 9 percent by weight of tannic acid.

4. The method of claim 2 wherein the alcohol of such alcoholic solution of tannic acid is a liquid aliphatic alcohol.

5. The method of claim 2 wherein such alcoholic solution of tannic acid comprises an aqueous solution containing from about 8 percent to about 20 percent by volume of a monohydric alkyl alcohol having from 1 to 3 carbon atoms.

6. The method of claim 2 wherein such aqueous chromic acid solution contains sufficient chromic acid to impart a pH of from 1.0 to 3.8.

7. The method of claim 2 wherein such aqueous chromic acid solution contains from about 0.5 percent to about 1.5 percent by weight of chromic acid and from about 2 percent to about 7 percent by weight of copper bichromate.

8. In the method of forming a deep etch plate by coating a metal-surfaced plate with polyvinyl alcohol sensitized to light by a bichromate, exposing selected areas of the coat to light to harden such areas, washing away the unexposed areas of the coat, treating the remaining exposed areas with an aqueous acid solution, drying and heat-hardening the treated exposed areas, and then etching the exposed portions of the metal-surfaced plate; the improvements comprising in combination effecting such acid solution treatment by treating the exposed areas sequentially first with an alcoholic solution of tannic acid and then with an aqueous chromic acid solution of copper bichromate prior to such heat-hardening step, whereby such hardening step may be effected at a temperature below about 225° F.

9. In the method of forming a polyvinyl alcohol resist by coating a base of metal selected from the group consisting of aluminum, zinc, and magnesium with polyvinyl alcohol sensitized to light by a bichromate selected from the group consisting of ammonium, sodium, and potassium bichromates, exposing selected areas of the coat to light to harden such areas, washing away the unexposed areas of the coat, treating the remaining exposed areas with an aqueous acid solution, and then drying and heat-hardening the treated exposed areas; the improvements comprising in combination effecting such acid solution treatment prior to the drying and heat-hardening step by treating the exposed areas initially with an aqueous solution containing from about 8 percent to about 20 percent by volume of ethyl alcohol and from about 0.1 percent to about 9 percent by weight of tannic acid, and then treating the exposed areas with an aqueous solution containing from about 0.5 percent to about 1.5 percent of chromic acid and from about 2 percent to about 7 percent copper dichromate, such acid solution having a pH from about 1.0 to about 3.8, and then heating the resist to a temperature within the range of about 180° F. to about 225° F. to heat-harden it at a relatively low temperature.

References Cited by the Examiner

UNITED STATES PATENTS

| | | | |
|---|---|---|---|
| 1,751,909 | 3/1930 | Davis | 96—36 |
| 2,249,514 | 7/1941 | Berg et al. | 260—91.3 |
| 2,393,821 | 1/1946 | Schoen et al. | 96—36 |
| 2,604,388 | 7/1952 | Staeble | 96—36 |
| 2,827,390 | 3/1958 | Garrigus | 96—35 |
| 2,830,899 | 4/1958 | Brown | 96—36 |

OTHER REFERENCES

Brown, Studies of Thermosetting Polyvinyl Alcohol Systems, Rubber Age, November 1952, pp. 211–214.

NORMAN G. TORCHIN, *Primary Examiner.*

HAROLD N. BURSTEIN, *Examiner.*